United States Patent [19]
Griffith et al.

[11] Patent Number: 5,277,749
[45] Date of Patent: Jan. 11, 1994

[54] METHODS AND APPARATUS FOR RELIEVING STRESS AND RESISTING STENCIL DELAMINATION WHEN PERFORMING LIFT-OFF PROCESSES THAT UTILIZE HIGH STRESS METALS AND/OR MULTIPLE EVAPORATION STEPS

[75] Inventors: Jonathan H. Griffith, Poughkeepsie; John I. Kim, Fishkill, both of N.Y.; Thomas L. Leong, San Jose, Calif.; William J. Tilly, Poughkeepsie, N.Y.; Sari Wacks, Forest Hills, N.Y.

[73] Assignee: International Business Machines Corporation, Armonk, N.Y.

[21] Appl. No.: 778,496

[22] Filed: Oct. 17, 1991

[51] Int. Cl.⁵ ............................................. C23C 14/00
[52] U.S. Cl. ................................. 156/643; 156/653; 156/655; 156/657; 156/661.1; 427/250; 427/282
[58] Field of Search ............... 156/661.1, 653, 643, 156/668, 657, 654, 655; 427/282, 250

[56] References Cited

U.S. PATENT DOCUMENTS

| | | | |
|---|---|---|---|
| 4,367,119 | 1/1983 | Logan et al. | 156/643 |
| 4,497,684 | 2/1985 | Sebesta | 156/643 |
| 4,519,872 | 5/1985 | Anderson, Jr. et al. | 156/661.1 X |
| 4,692,206 | 9/1987 | Sachdeu et al. | 156/643 |
| 4,826,564 | 5/1989 | Desilets et al. | 156/661.1 X |
| 4,846,931 | 7/1989 | Gmitter et al. | 156/655 X |
| 5,073,230 | 12/1991 | Maracas et al. | 156/655 X |

*Primary Examiner*—Thi Dang
*Attorney, Agent, or Firm*—Graham S. Jones, II; Joseph J. Kaliko; Donald M. Boles

[57] ABSTRACT

A layer of photoresist provides a stress relief (or cushion) layer between a lift-off polymer layer and a barrier of multi-level lift-off structures. When multiple evaporation steps are required using the same lift-off pattern, the adhesion between organosilicon and organic film is stressed by a first blanked metal film. To prevent delamination between the lift-off polymer layer and RIE barrier photoresist is applied on top of the lift-off polymer and sandwiched between the organosilicon and organic materials. This photoresist acts as a cushion and as an adhesion promoter to reduce delamination after the metal deposition(s).

19 Claims, 3 Drawing Sheets

METHODS AND APPARATUS FOR RELIEVING STRESS AND RESISTING STENCIL DELAMINATION WHEN PERFORMING LIFT-OFF PROCESSES THAT UTILIZE HIGH STRESS METALS AND/OR MULTIPLE EVAPORATION STEPS

BACKGROUND OF THE INVENTION

1. Field of the Invention

The invention relates generally to the fabrication of semiconductor components such as integrated circuits. More particularly, the invention relates to (1) processes for fabricating delamination resistant multi-layer lift-off stencils; (2) delamination resistant multi-layer lift-off stencils per se, whether a product of the aforementioned processes or created by alternative techniques; and (3) methods for applying metalized interconnections to a lift-off structure that includes a stress relief (or "cushioning") layer as part of the lift-off stencil.

The invention is particularly useful in situations where it is desirable to deposit several microns of metal on a substrate, where high stress metals (like nickel) are to be deposited and/or in situations where multiple evaporation steps are required to fabricate a semiconductor component.

2. Description of the Related Art

Many recent patents and technical articles have been directed to advances in the field of semiconductor component fabrication using improved materials and processes. Such improved materials and processes have been useful in meeting increasingly demanding requirements for advanced integrated circuit fabrication, particularly those integrated circuits that include high density interconnective multi-level metallurgy systems.

As an example of the aforementioned advances, U.S. Pat. No. 4,692,205, to Sachdev et al, issued Sep. 28, 1987, assigned to the International Business Machines Corporation, teaches the use of what was then a new material, silicon-containing polyimides, as an oxygen etch barrier in a metal lift-off process and as an oxygen etch stop in the fabrication of multi-layer metal structures.

U.S. Pat. No. 4,692,205 is hereby incorporated by reference, not only for the its specific teaching of silicon-containing polyimides as an oxygen etch barrier, etc., but also for its review of lift-off processes in general and its teaching of exemplary commercially available chemicals that may be used in fabricating various layers of the stencil structure to be described hereinafter.

More particularly, the aforementioned reference describes a lift-off method for fabricating fine metal lines in a process that requires contacting films to maintain mechanical and interfacial integrity. However, the processes described in the incorporated reference do not maintain the desired mechanical and interfacial integrity of film layers in stencils used to fabricate semiconductor components in situations where high stress metals (such as nickel) are used, or in situations where multiple step metallization processes need to be performed. Multiple step metallization processes are, for example, often performed when multi-level metallurgy systems require different metal thickness on the same substrate.

A specific problem encountered in semiconductor component fabrication processes utilizing high stress metals and/or multiple step metallization processes, is the delamination of interfacing films. Such delamination destroys the stencil structure being used to fabricate a semiconductor component and can significantly decrease the yield of acceptable components, making delamination an undesirable characteristic of prior art lift-off techniques in general (including the one taught in the incorporated reference), for which it is presently desirable to find a remedy.

To be more specific, well known lift-off methods for forming metallized structures, such as the one taught in the incorporated reference, involve the fabrication of a multi-layer stencil comprising a solvent removable polymer film as the base or lift-off layer on a substrate. This lift-off layer is sequentially overcoated with a thin oxygen reactive ion etch (RIE) barrier and a resist layer.

The desired pattern in the resist layer can be delineated by standard lithographic techniques and then replicated into the underlying RIE barrier layer by the RIE process using carbon tetrafluoride ($CF_4$) ambient, followed by an oxygen plasma to etch the pattern into the lift-off layer. Subsequent blanket metal evaporation and solvent soak (e.g., N-methyl-pyrrolidone (NMP)) is employed to accomplish the removal of the lift-off stencil, leaving the desired metal pattern intact on the substrate surface.

Conventional oxygen RIE barrier films, such as plasma polymerized organosilicon HMDS (hexamethyldisilazane) suffer adhesion problems when high stress metal is (or metals are) evaporated and/or multiple evaporation steps are used to have different metal thickness deposited on the substrates.

When multiple evaporation steps are used the lift-off stencil is thermally stressed even more because, for example, a stencil covered with high stress blanket metal is heated and cooled in an evaporator during each subsequent evaporation step to achieve a desired metal thickness. Adhesion between the RIE barrier and the organic polymer is then sometimes insufficient to withstand process induced stress and thermal stress created by the difference of thermal coefficient of evaporated metal/RIE barrier and organic polymer.

The result is that the interfacial integrity of film layers in stencils used to fabricate semiconductor components in situations where high stress metals and/or multiple step metallization processes are used are prone to suffer from the aforementioned undesirable delamination characteristic.

Accordingly, it would be desirable to provide a multi-layer delamination resistant lift off stencil that can withstand the stresses induced by high stress metals, the deposition of relatively "thick" (several micron) layers of metal, and thermal stress introduced by multiple evaporation steps.

Furthermore, it would be desirable to provide processes for fabricating such a stencil as part of a novel lift-off structure and to provide methods for utilizing such a structure to perform both single and multiple step metallization processes in general.

Still further, it would be desirable to provide improved materials and processes for depositing different thickness of metal on a substrate to facilitate the fabrication of advanced integrated circuits that specifically include high density interconnective multi-level metallurgy systems.

SUMMARY OF THE INVENTION

It is an object of this invention is to provide a lift-off structure, including a multi-layer lift-off stencil, that can withstand high stress metals and thermal stress introduced by multiple evaporation steps.

It is a further object of the invention to provide a multi-layer lift-off stencil that is delamination resistant, particularly when high stress metals and/or metallization processes that require multiple evaporation steps are used in fabricating semiconductor components.

Furthermore, it is an object of the invention to provide processes for fabricating lift-off structures, including the aforementioned multiple-layer delamination resistant lift-off stencil, that realize the aforestated objectives.

Further yet, it is an object of the invention to provide methods for utilizing such a structure to perform metallization processes in general.

Still further, it is an object of the invention to provide improved materials and processes for depositing different thickness of metal on a substrate to facilitate the fabrication of advanced integrated circuits that specifically include high density interconnective multi-level metallurgy systems.

Yet another object of the invention is to provide methods and apparatus for relieving the stress induced in multi-layer lift-off stencils that are blanketed with a relatively thick layer (or layers) of metal, such as, for example only, 6–8 microns of metal.

According to one aspect of the invention, a commercially available photoresist, such as a novolak based resist, is used as a stress relief (or cushioning) layer between the conventionally adjacent lift-off polymer and RIE barrier described, for example, hereinafter with reference to the stencil depicted in FIG. IA. (corresponding to the stencil described with reference to FIG. 1A of the incorporated patent).

In general lift-off practice, the RIE barrier is a plasma-polymerized organosilicon film that acts as a ledge for the organic lift-off polymer. The purpose of the ledge is such that when chemicals attack the soluble lift-off polymer, a path or channel around previously deposited metal is provided.

This is a useful structure for forming a metal pattern with one evaporation step. However, as indicated hereinbefore, when multiple evaporation steps are required using the same lift-off pattern, the adhesion between organosilicon and organic film is stressed by the first blanket metal film. This stress can cause the aforementioned undesirable delamination between the lift-off polymer layer and the RIE barrier forcing, for example, subsequent evaporation steps to be stopped.

In accordance with the teachings of the invention, the stress relief layer of photoresist referred to hereinabove is applied on top of the lift-off polymer and sandwiched between the organosilicon and the organic materials. This photoresist then acts as a cushion and as an adhesion promoter to reduce undesirable delamination after the metal deposition(s).

According to one embodiment of the invention, the new delamination resistant lift-off stencil structure is achieved by performing the steps of spinning (or spraying) and then baking a soft resist between organic polymer and the RIE barrier. This additional layer then acts as stress relief for the blanket metal that is deposited on the RIE barrier since the photoresist has more elastic characteristics than organic polymer. As a result, RIE barrier adhesion to the whole stencil is greatly enhanced.

In accordance with an alternate embodiment of the invention, a method of fabricating a delamination resistant multi-layer lift-off stencil on a substrate is set forth, wherein said stencil includes a lift-off polymer layer, a reactive ion etch (RIE) barrier and a stress relief layer for relieving stresses otherwise produced at the junction of said lift-off polymer layer and RIE barrier during single and multiple step metallization processes, comprising the steps of: (a) depositing said lift-off polymer layer on said substrate; and (b) depositing said stress relief layer and said RIE barrier over said lift-off polymer layer such that said stress relief layer is interposed between said lift-off polymer layer and said RIE barrier to form a cushion therebetween and act as an adhesion promoter to resist stencil delamination.

In accordance with yet another embodiment of the invention a delamination resistant multi-layer lift-off stencil is set forth, comprising: (a) a lift-off polymer layer deposited on a substrate; (b) a stress relief layer deposited on said lift-off polymer layer; and (c) an RIE barrier deposited on said stress relief layer, wherein said stress relief layer acts as a cushion and as an adhesion promoter to resist stencil delamination by relieving stresses otherwise produced at the junction of said lift-off polymer layer and RIE barrier during single and multiple step metallization processes.

Still another embodiment of the invention contemplates a method for applying metallized interconnections to a lift-off structure that includes a substrate, a lift-off polymer layer deposited onto said substrate, a stress relief layer deposited onto said lift-off polymer layer, a reactive ion etch (RIE) barrier deposited onto said stress relief layer and a photoresist layer deposited onto said RIE barrier, comprising the steps of: (a) patterning the photoresist layer to create a predefined image therein; and (b) replicating the predefined image patterned in the photoresist layer into the lift-off polymer layer, the stress relief layer and the RIE barrier using carbon tetraflouride to first etch the RIE barrier and then use an oxygen plasma to etch the stress relief and lift-off polymer layers such that the RIE barrier overhangs the edges of the stress relief and lift-off polymer layers to facilitate metal lift-off processing.

The stencil structure described herein features the same desired overhang after RIE into the underlying lift-off layer as exhibited by prior art stencils, inhibits outgassing during evaporation, and facilitates clean lift-off using a standard solvent soak to provide the desired metal pattern on the semiconductor component. The process of creating a desired pattern utilizing the teachings of the invention can, therefore, be utilized together with existing techniques, such as photolithography, wet and dry etching, etc., to fabricate a desired semiconductor component.

Additionally, the invention features multi-layer stencils which inherently exhibit delamination resistant characteristics and which are particularly well suited for use in metallization processes that utilize high stress metals and/or multiple step evaporation processes.

These and other objects and features of the present invention and the manner of obtaining them will become apparent to those skilled in the art, and the invention itself will be best understood by reference to the following detailed description read in conjunction with the accompanying Drawing.

DETAILED DESCRIPTION

Figure 1A:
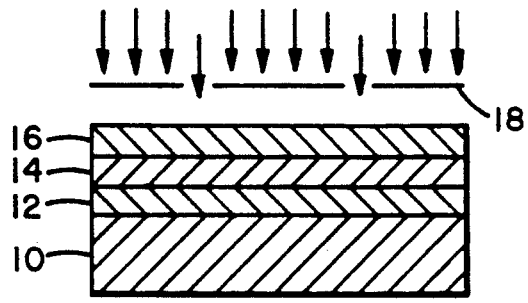
FIGS. 1A–1F illustrate schematically the steps of a prior art tri-layer resist process which may be advantageously used to blanket deposit a single layer of relatively thin metal film (on the order of approximately one micron or less) on a substrate.

According to a prior art lift-off process described in the incorporated reference, described herein for the sake of completeness and comparison with the instant invention, a substrate 10 (shown in FIG. 1A), which may, for example, be a silicon wafer used in a semiconductor component fabrication process, is first surface treated with a 0.1% aqueous solution of gamma-aminopropyltriethoxysilane (gamma-APS) by spin application at 2,000 RPM for 30 seconds, followed by a 5 minute bake at 85° C. (hot plate). The surface treatment enhances the adhesion between the substrate 10 and a subsequently applied lift-off underlayer 12.

Lift-off underlayer may be spin applied at 2,000 RPM for 30 seconds and baked at 85° C. for 10 minutes, 150 degrees C. for 15 minutes, and 230° C. for 20 minutes, to form an approximately 2.1 micron thick coating. AZ1350J, commercially available from the Shipley Company was found to be suitable for use as the lift-off layer according to the teachings of the incorporated reference.

The lift-off layer described in the reference must be suitable for etching with $O_2$ plasma or reactive ion etch (RIE) processing. This layer typically includes organic polymers such as AZ1350, AZ1350J (product of Shipley Co.), polysulfone resin (ICI Co.), or soluble polyimides.

Following the application of layer 12, according to the teachings of the reference, an oxygen RIE barrier 14 is applied. Silicon-containing polyimide #250-65 or #250-50, available commercially from the M&T Company, is diluted 1:2.5 with diglyme, filtered through a 0.45 micron silver filter, and spin-applied on the baked lift-off layer 12 at 3,000 RPM for 30 seconds. A bake sequence of 85° C. for 10 minutes, 150 degrees C. for 15 minutes, and 230° C. for 20 minutes follows, resulting in an approximately 0.25–0.30 micron thick layer of the silicon polyimide.

Next, a layer of resist 16 is applied over the silicon-containing polyimide barrier layer 14. To enhance the adhesion of the resist 16 to the silicon-polyimide layer 14, the surface of silicon-polyimide layer 13 is pretreated with HMDS-gamma-APE vapor in Freon-TF for 5 minutes or with a 0.1% solution of a gamma-APS in toluene by spin coating. The layer of diazonaphthoquinonenovolak resist 16 is applied at 3,000 RPM for 30 seconds followed by a 30 minute bake at 85° C. to form a thick film approximately 0.9–1.1 microns thick.

The resist layer 16 can be a standard resist material known in the art, it may be positive or negative, and may be sensitive to near, mid or deep UV; electron beam; X-ray; ion beam; or laser. Examples are novolak based resists with diazoquione type of photoactive component, acrylate polymers such as PMMA, polyolefin sulfones, etc. Patterning of the resist can be carried out according to standard lithographic processes.

Figure 1B:
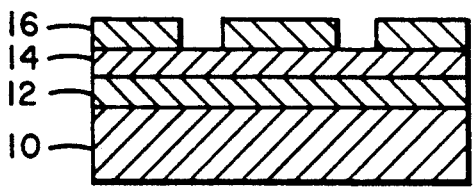
Figure 1C:
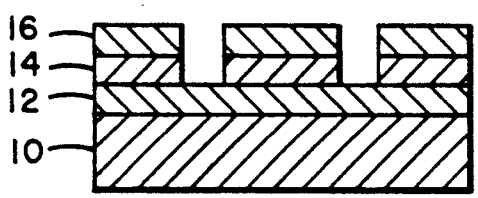

After exposure to mid-UV light though mask 18, resist layer 16 is developed with AZ2401 (Shipley Co.) developer diluted 1:3.5 with deionized water (FIG. 1B). The image in the resist layer 16 is subsequently replicated into the silicon-containing polyimide layer 14 by RIE using a $CF_4$—$O_2$ mixed gas system at a 2.5:1 flow rate ratio at 38–48 mtorr, with power level in the range 250–300 watts. Under these conditions, the barrier layer 14 can be etched at the rate of 1100–1300 Angstroms/min. The resulting structure is shown in FIG. 1C.

Figure 1D:
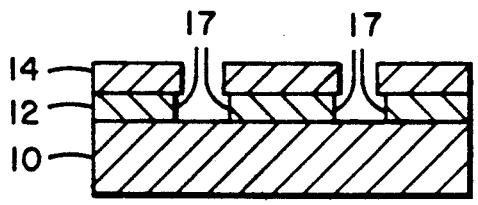

Subsequent image transfer down to the substrate 10 is accomplished by an $O_2$ RIE at 40 mtorr and 300 watts with 50–95% overetch past end point. The resulting structure is seen in FIG. 1D. The overetch provides for the overhang 17 which facilitates the metal lift-off process.

Figure 1E:
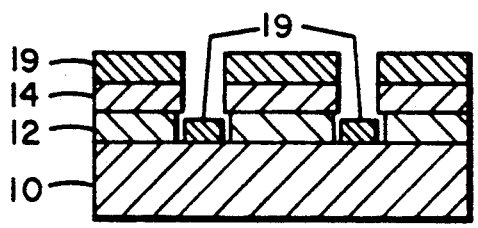
Figure 1F:
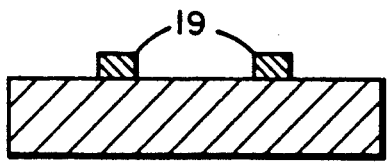

Referring to FIG. 1E, the silicon-containing polyimide layer 14 and exposed areas of substrate 10 are sputter cleaned for 6 minutes at 220° C. prior to metallization. A blanket layer of metal 19, such as Al-Cu, is evaporated over the exposed surfaces at 120° C. to 150° C. Following this evaporation, the lift-off is accomplished by the standard solvent soak in N-methylpyrrolidone (NMP) for 2 hours with brief ultrasonic agitation to accelerate removal of the lift-off stencil, leaving the metallurgy network 19 as shown in FIG. 1F. The metal film may be any metal conventionally employed, e.g., aluminum, copper alloy, palladium, platinum, chromium, etc.

In alternate embodiments described in the reference, soluble polyimide XU284, manufactured by Ciba Geigy, or other lift-off layers can be used in place of the baked AZ layer 12. The lift-off layer can be 1–5 μm in thickness, the silicon polyimide layer is typically in the range 0.15–0.65 μm and the imaging layer thickness is adjusted such that the desired level of image resolution and reduction of defect density is achieved. The imaging layer thickness is typically in the range 0.15–7.2 μm. All other processing steps would follow as described above.

For all of the reasons set forth hereinbefore (stress occurring when utilizing high stress metals, the temperatures endured by a stencil when performing multiple step metallization processes, delamination problems resulting from the aforementioned operations, etc.), the types of processes described with reference to FIGS 1A–1F are not always suitable for present day integrated circuit fabrication applications.

Figure 2:
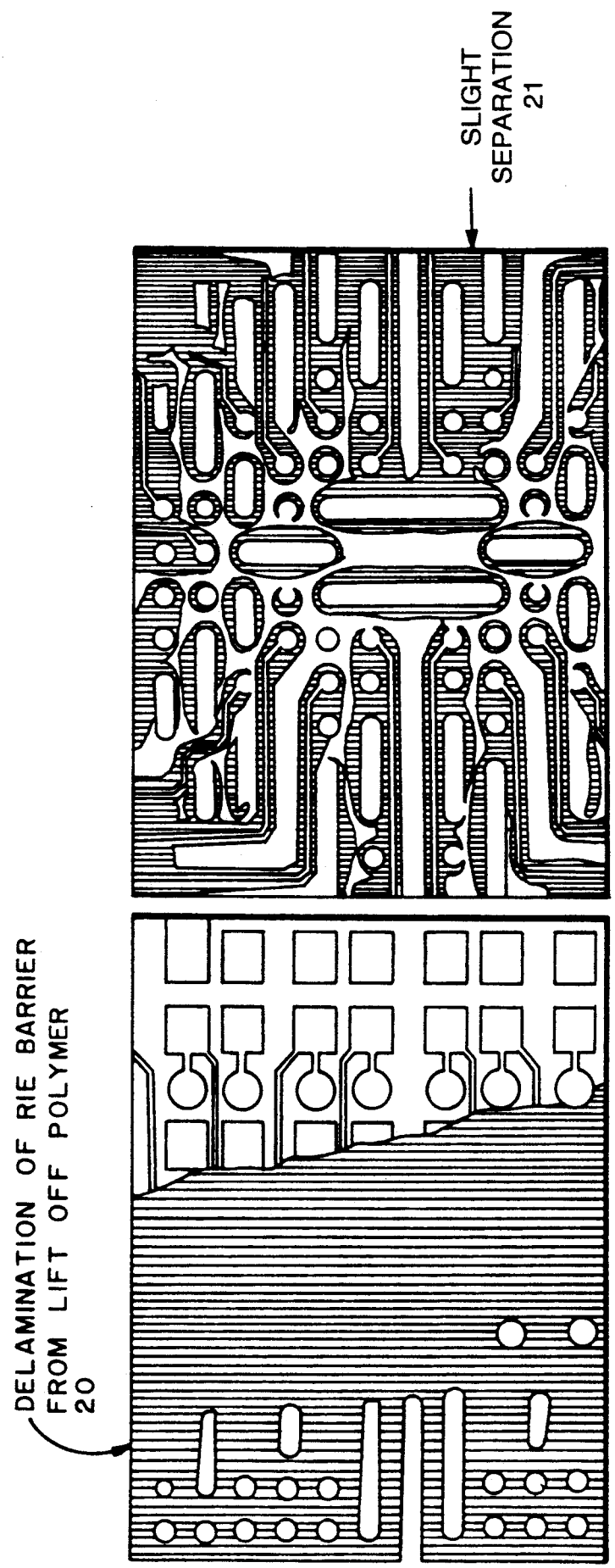
FIG. 2 is a copy of a photograph which illustrates the undesirable delamination of a RIE barrier from lift-off polymer that often occurs using prior art resist processes when high stress metals and/or multiple step evaporation processes are performed.

The delamination problems that can occur using prior art resist processes is illustrated by the photograph shown in FIG. 2. The demarcation line 20, actually shows the undesirable delamination. A less severe, but nevertheless unacceptable, separation of stencil layers is shown at 21 in FIG. 2.

A different resist process, stencil, etc., is contemplated by the invention and will be described hereinafter with reference to FIGS. 3A–3G.

Figure 3A:
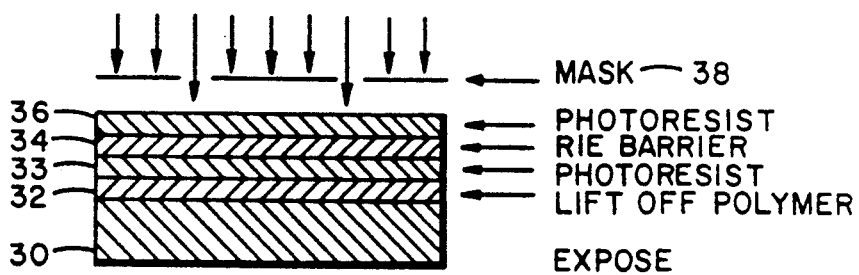
FIGS. 3A–3G illustrates schematically the steps of an illustrative four layer resist process, contemplated by the invention, which may be advantageously used to blanket deposit high stress metals and/or perform multiple step metallization processes resulting in the deposit of several microns of metal on a semiconductor wafer or packaging substrate made, for example, of glass, silicon or ceramic material having redistribution layers.

FIG. 3A depicts an illustrative embodiment of the stencil structure contemplated by the invention, including a base of substrate 30 (for example, silicon wafers, ceramic substrates, polyimide packing layers, or metal on ceramic wafers) surface treated with a 0.1% aqueous solution of gamma-APS by spin application at 2500

RPM for 30 seconds, followed by a 100° C. bake for 30 minutes.

The aforementioned surface treatment (similar to the one taught in the incorporated reference) enhances the adhesion between the substrate and a subsequent lift-off polymer.

The illustrative lift-off underlayer, 32, is spin applied at 500 RPM for 10 seconds and then sped up to 2200 RPM for 30 seconds. The type of lift-off layer is not critical for the purposes of the invention being described herein so long as it can be etched with an oxygen plasma or by RIE processing.

According to one illustrative embodiment of the invention, following the application of lift-off layer 32, a film of soft resist is spin applied at 2500 RPM for 30 seconds resulting in a metal thickness of 1-3 microns. This layer, layer 33 shown in FIGS. 3A-3F, will act as stress relief layer between lift-off layer 32 and an RIE barrier layer shown in FIG. 3 as RIE layer 34.

Next, according to the illustrative embodiment of the invention being set forth herein, RIE layer 34 (for example an oxygen RIE barrier such as a silicon based compound), is deposited by chemical vapor deposition (CVD) or plasma polymerized organosilicons such as HMDS (hexamethyldisilazane).

Furthermore, according to the illustrative embodiment of the invention being described herein, another resist layer, layer 36, is applied on top of RIE barrier 34. Resist layer 36 can be a standard, commercially available resist material known in the art, it may be positive or negative, and may be sensitive to near mid or deep UV. Patterning of the resist can be carried out using standard lithographic processes.

Figure 3B:
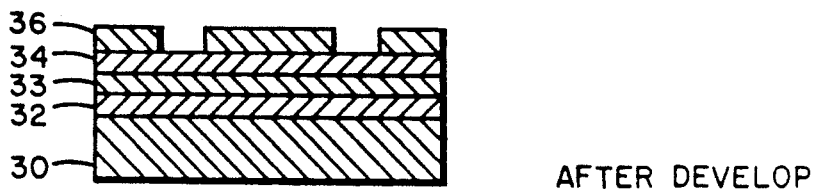

After exposure to UV light through the 38 mask, resist layer 36 is developed. This is depicted in FIG. 3B.

Figure 3C:
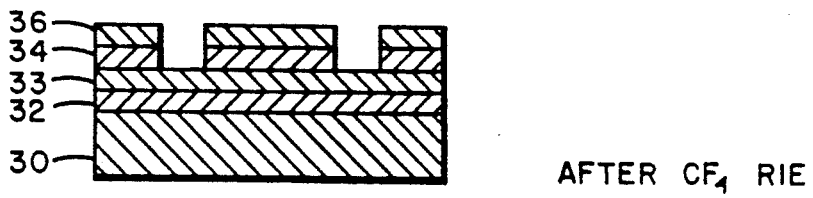
Figure 3D:
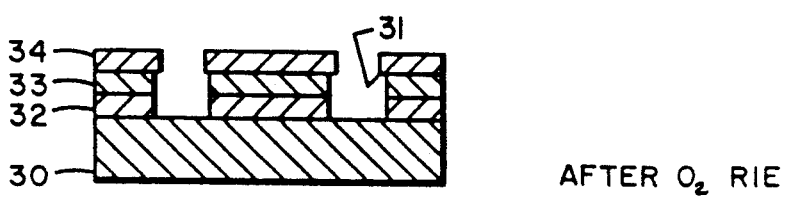

The image in resist layer 36 is subsequently replicated into the lift-off polyimide/resist/RIE barrier (i.e., layers 32, 33 and 34 respectively as shown in FIGS. 3C and 3D) by RIE using CF₄ first to etch the RIE barrier (layer 34), as shown in FIG. 3C; and then oxygen to etch the stress relief resist layer (layer 33) and the lift-off polyimide (layer 32) as shown in FIG. 3D. Lift-off polyimide is over etched 50-90% past end point to provide for the overhang 31 which facilitates the metal lift-off process.

Next, metal evaporation can take place with above described stencil (depicted in FIGS. 3D-3G).

According to the illustrative embodiment of the invention, prior to actual metal deposition substrate 30 is heated to 175° C. and then sputter etched for 2 minutes.

Figure 3E:
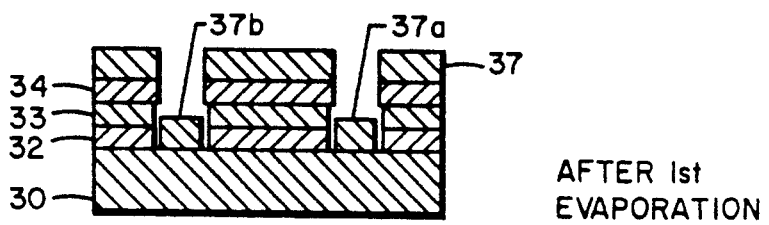

Next, a blanket metal evaporation, which can be a single metal or composite metal like, for example, Cr-Cu-Ni-Au, is applied as shown in FIG. 3E. FIG. 3E depicts the metal blank layer 37 after it has been evaporated onto RIE barrier 34, with metal lines 37a and 37b shown deposited on the substrate. It should be noted that overhang 31 inhibits blanket metal from filling the cavity etched in the stencil and will allow for easy stencil removal at the completion of the metallization process.

When different metal thickness is required in a certain region of substrate, a metal mask, such as mask 39, can, for example, be made from molybdenum and be used to mask out portions of the substrate when evaporating additional metal. During any additional evaporation steps, good RIE barrier adhesion is very critical. If RIE barrier 34 either peels or delaminates, metal masking operations cannot continue to be used and the substrate would be subsequently scrapped, diminishing yield.

Figure 3F:
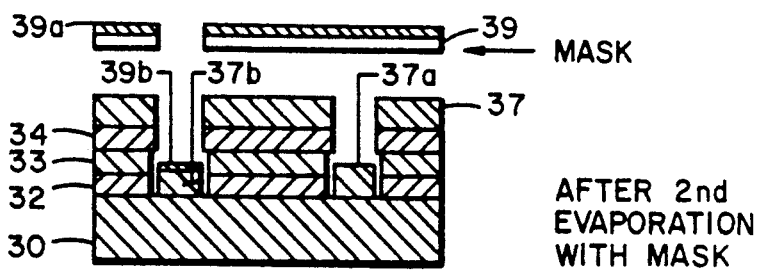

Following the additional evaporation step depicted in FIG. 3F, additional blanket metal can be seen (39a) on top of mask 39 and the desired additional layer of metal not masked by mask 39 may be seen as metal 39b on top of previously deposited metal 37b.

Figure 3G:
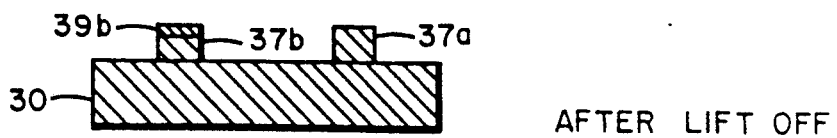

Finally, after the desired evaporation steps are performed, the lift-off of the remaining stencil may be accomplished by using a standard solvent soak in hot NMP (95 C.) for 20 minutes with ultrasonic agitation to accelerate removal of the stencil, leaving the desired metallurgy pattern on substrate 30, as shown by reference numerals 37b, 39b and 37a in FIG. 3G.

Those skilled in the art will readily appreciate that a precaution to be taken when executing the aforestated illustrative process is that any bake operation performed after the stencil is built should be lower than the glass transition temperature of the photoresist components of the stencil and stress relief layer.

What has been described are methods and apparatus for relieving stress and resisting stencil delamination when performing lift-off processes that utilize high stress metals and/or multiple evaporation steps. Processes for fabricating such apparatus and facilitating the practice of the aforesaid methods are also set forth, together with methods for applying metallized interconnections to the lift-off structures contemplated herein. These methods, apparatus and processes realize all of the objectives set forth hereinbefore.

Those skilled in the art will recognize that the foregoing description has been presented for the sake of illustration and description only. It is not intended to be exhaustive or to limit the invention to the precise form disclosed, and obviously many modifications and variations are possible in light of the above teaching.

The embodiments and examples set forth herein were presented in order to best explain the principles of the instant invention and its practical application to thereby enable others skilled in the art to best utilize the instant invention in various embodiments and various modifications as are suited to the particular use contemplated. Accordingly, it is intended that the invention described herein in the aforementioned illustrative sense be limited only as specified in the claims.

What is claimed is:

1. A method of fabricating a delamination resistant multi-layer lift-off stencil on a substrate, wherein said stencil includes a lift-off structure including a lift-off polymer layer (32), a reactive ion etch (RIE) barrier (34) and a stress relief layer (33) for relieving stresses otherwise produced at the junction of said lift-off polymer layer (32) and RIE barrier (34) during single and multiple step metallization processes, comprising the steps of:
   (a) depositing said lift-off polymer layer (32) on said substrate; and
   (b) depositing said stress relief layer (33) and said RIE barrier (34) over said lift-off polymer layer (32) such that said stress relief layer (33) is interposed between said lift-off polymer layer (32) and said RIE barrier (34) to form a cushion therebetween and act as an adhesion promoter to resist stencil delamination,
   (c) forming in said lift-off structure a pattern exposing a portion of the surface of said substrate,
   (d) applying metal to said lift-off structure by evaporating at least one layer of metal onto said lift-off structure and onto said substrate through said pattern formed in said lift-off structure; and (e) removing the remainder of said lift-off structure, leaving a metal pattern on said substrate.

2. A method as set forth in claim 1 further comprising the steps of:
   (a) treating the surface of the substrate with an adhesion promoter; and
   (b) baking said substrate prior to depositing said lift-off polymer layer thereon.

3. A method as set forth in claim 1 wherein said lift-off layer is a polymer that may be etched by oxygen plasma.

4. A method as set forth in claim 1 wherein said lift-off layer is polymer that may be etched by RIE processing.

5. A method as set forth in claim 1 wherein said lift-off polymer layer is spin applied.

6. A method as set forth in claim 1 wherein said stress relief layer is a soft resist film.

7. A method as set forth in claim 6 wherein said stress relief layer is spin applied.

8. A method as set forth in claim 1 wherein said RIE barrier is a silicon based compound deposited by a chemical vapor deposition process.

9. A method as set forth in claim 1 wherein said RIE barrier is a plasma polymerized organosilicon.

10. A method as set forth in claim 1 further comprising the step of depositing a photoresist layer over said RIE barrier.

11. A method as set forth in claim 10 wherein said photoresist layer may be patterned utilizing a lithographic process.

12. A method for applying metallized interconnections to a lift-off structure formed on a substrate, said lift-off structure including a lift-off polymer layer deposited onto said substrate, a stress relief layer deposited onto said lift-off polymer layer, a reactive ion etch (RIE) barrier deposited onto said stress relief layer and a photoresist layer deposited onto said RIE barrier, comprising the steps of:
   (a) patterning said photoresist layer to create a predefined image therein;
   (b) replicating said predefined image patterned in said photoresist layer into said lift-off polymer layer, said stress relief layer and said RIE barrier using carbon tetrafluoride to first etch said RIE barrier and then oxygen to etch said stress relief and lift-off polymer layers such that said RIE barrier overhangs the edges of said stress relief and lift-off polymer layers to facilitate metal lift-off processing, thereby forming a lift-off stencil portion of said lift-off structure
   (c) applying metal to said lift-off structure by evaporating at least one layer of metal onto said substrate utilizing said lift-off structure; and
   (d) removing said lift-off stencil portion of said lift-off structure, leaving a metallurgy pattern on said substrate, utilizing a solvent soak.

13. A method as set forth in claim 12 further comprising the steps of heating and sputter etching said substrate prior to the step of metal evaporation.

14. A method as set forth in claim 13 further comprising the step of utilizing a metal mask to mask out unwanted areas of additional metal whenever different metal thicknesses are required in certain regions of said substrate.

15. A method for applying metallized interconnections to a lift-off structure formed on a substrate, said lift-off structure including a lift-off polymer layer deposited onto said substrate, a stress relief layer deposited onto said lift-off polymer layer, a reaction ion etch (RIE) barrier deposited onto said stress relief layer and a photoresist layer deposited onto said RIE barrier, comprising the steps of:
   (a) patterning said photoresist layer to create a predefined image therein; and
   (b) replicating said predefined image patterned in said photoresist layer into said lift-off polymer layer, said stress relief layer and said RIE barrier using carbon tetrafluoride to first etch said RIE barrier and then oxygen to etch said stress relief and lift-off polymer layers such that said RIE barrier overhangs the edges of said stress relief and lift-off polymer layers to facilitate metal lift-off processing,
   (c) forming in said liftoff structure a pattern exposing said substrate through said pattern,
   (d) applying metal to said lift-off structure and through said pattern onto said substrate, and
   (e) removing the remainder of said lift-off structure, leaving a metal pattern on said substrate.

16. A method as set forth in claim 15 wherein the step of patterning is accomplished by utilizing a lithographic process to develop said photoresist through a mask.

17. A method of fabricating and using a delamination resistant multi-layer lift-off stencil, wherein said stencil includes a lift-off structure including an organic lift-off polymer layer covering a substrate and a reactive ion etch (RIE) barrier, comprising the steps of:
   (a) spinning a soft resist between said organic lift-off polymer layer and said RIE barrier;
   (b) baking said soft resist therebetween to form a stress relief layer for blanket metal deposited on said RIE barrier,
   (c) patterning said lift-off structure with a pattern exposing said substrate through said pattern,
   (d) applying metal to said lift-off structure and through said pattern onto said substrate, and
   (e) removing the remainder of said lift-off structure, leaving a metal pattern on said substrate.

18. A method of fabricating and using a delamination resistant multi-layer lift-off stencil, wherein said stencil includes a lift-off structure including an organic lift-off polymer layer covering a substrate and a reactive ion etch (RIE) barrier, comprising the steps of:
   (a) spraying a soft resist between said organic lift-off polymer layer and said RIE barrier;
   (b) baking said soft resist therebetween to form a stress relief layer for blanket metal deposited on said RIE barrier,
   (c) forming a pattern in said liftoff structure exposing said substrate through said pattern,
   (d) applying metal to said lift-off structure through said pattern onto said substrate, and
   (e) removing the remainder of said lift-off structure, leaving a metal pattern on said substrate.

19. A method for performing and using a metallization process utilizing high stress metals and/or multiple step evaporation, and for relieving stress and preventing multi-layer stencil delamination, wherein said stencil includes a lift-off structure including an organic lift-off polymer layer covering a substrate and a reactive ion etch (RIE) barrier, comprising the steps of:

(a) utilizing said RIE barrier as a ledge for said organic lift-off polymer layer;
(b) utilizing a photoresist as a stress relief layer between said lift-off polymer and RIE barrier,
(c) forming a pattern in said lift-off structure with said pattern exposing said substrate through said pattern,
(d) applying metal to said lift-off structure and through said pattern onto said substrate, and
(e) removing the remainder of said lift-off structure, leaving a metal pattern on said substrate.

* * * * *